United States Patent

Acket et al.

[15] 3,648,185

[45] Mar. 7, 1972

[54] SEMICONDUCTOR DEVICE FOR AMPLIFYING MICROWAVES

[72] Inventors: Gerard Adriaan Acket; Marinus Teunis Vlaardingerbroek, both of Emmasingel, Eindhoven, Netherlands

[73] Assignee: U.S. Philips Corporation, New York, N.Y.

[22] Filed: June 18, 1969

[21] Appl. No.: 834,280

[30] Foreign Application Priority Data

June 29, 1968 Netherlands ..........6809255

[52] U.S. Cl. ..........330/5, 330/34

[51] Int. Cl. ..........H03f 3/04

[58] Field of Search ..........330/5

[56] References Cited

UNITED STATES PATENTS

| | | | |
|---|---|---|---|
| 3,487,334 | 12/1969 | Eastman et al. | 331/107 G |
| 3,526,844 | 9/1970 | Bartelink et al. | 330/5 |
| 3,439,236 | 4/1969 | Blicher | 331/107 G |
| 3,551,831 | 12/1970 | Kino et al. | 330/5 |

OTHER PUBLICATIONS

Ramachandran, " Proc. IEEE," March 1968, pp. 336–338.
Koyama et al., paper submitted at " 1968– International Conference on GaAs" held at Dallas, Texas on Oct. 16–18, 1968.
" Electronics," Dec. 11, 1967, p. 255.

*Primary Examiner*—Roy Lake
*Assistant Examiner*—Darwin R. Hostetter
*Attorney*—Frank R. Trifari

[57] ABSTRACT

A semiconductor microwave amplifier is described with a construction to suppress the formation of travelling domains producing unwanted oscillations. The device construction includes an active epitaxial layer on a substrate, and adjoining the active layer a higher resistivity part. Contacts are provided on the active layer. The active layer is given a thickness below the length of a domain that might have formed. An advantage is that the contact spacing and dopant concentration of the active layer is much less critical.

5 Claims, 4 Drawing Figures

Patented March 7, 1972 3,648,185

2 Sheets-Sheet 1

Figure 1:
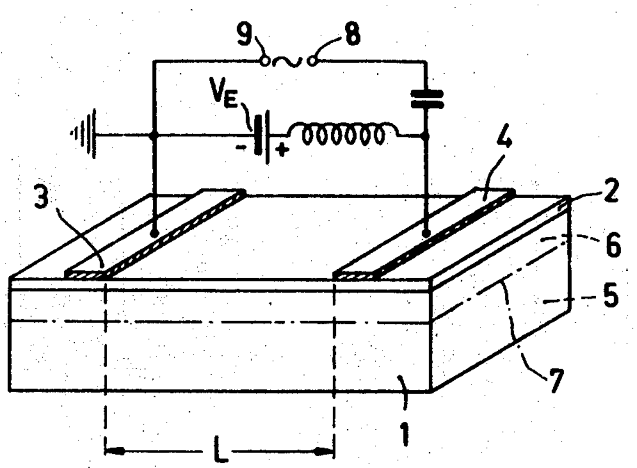

INVENTOR.
GERARD A. ACKET
MARINUS T. VLAARDINGERBROEK

BY

AGENT

*INVENTOR.*

GERARD A. ACKET
MARINUS T. VLAARDINGERBROEK

BY

AGENT

SEMICONDUCTOR DEVICE FOR AMPLIFYING MICROWAVES

The invention relates to a semiconductor device for amplifying microwaves comprising a semiconductor layer provided epitaxially on a substrate and having at least two connection contacts, in which layer a negative differential resistance can be established when the direct voltage between the connection contacts is sufficiently high.

Such devices are known and are used for producing or amplifying electric signals of high frequency. They are based on the phenomenon that in some semiconductor materials including, for example, gallium arsenide, gallium telluride, indium phosphide, and zinc selenide, a transition of electrons in the conductivity band occurs from one state having a lower energy and high mobility to a state having a higher energy and lower mobility when the field strength is sufficiently high (limit value for gallium arsenide approximately 3.5 kv./cm.). As a result of this a negative differential resistance occurs over a given voltage range. This negative differential resistance can be used for amplifying electric signals. The required field strength is obtained by applying a sufficiently high direct voltage between two connection contacts, the cathode contact and the anode contact, provided on the semiconductor body.

A known construction of such a device is described in "-Proceedings I.E.E.E.," May, 1967, pp. 718–719. This known device comprises a highly doped substrate of N-type gallium arsenide, on which substrate a very thin active epitaxial layer of N-type gallium arsenide is provided having a higher resistivity than the substrate, a donor concentration of $5.10^{15}$ at./ccm., and a thickness of a few $\mu$m. The connection contacts in this device are formed by the very low-ohmic substrate on the one hand, and by an ohmic electrode layer provided on the epitaxial layer on the other hand. Between said connection contacts the direct voltage is set up which is required for establishing a negative differential resistance, while also between said contacts, for example, through a coaxial cable, an input alternating signal is applied which is derived as an amplified reflected signal via the coaxial cable.

In such structures, the above-mentioned transition of electrons may in circumstances give rise to the formation of regions of high field strength, termed domains, in addition to the formation of a negative differential resistance, which domains move in the active layer from the cathode contact to the anode contact at a speed which is to an approximation equal to the drift velocity of the electrons. As a result of this, high frequency oscillations are formed between the connection contacts which however, in devices of the above-described type to which the invention relates, are undesireable and should be avoided. It can be calculated that in the said known devices this formation of domains in the epitaxial layer can be avoided, if the product of the concentration $n_o$ of majority charge carriers in the epitaxial layer and the distance L between the connection contacts is smaller than a particular limit value. If no external causes for the generation of charge carriers are present, for example, irradiation, the value $n_o$ substantially corresponds to the doping concentration. For an epitaxial layer of N-type gallium arsenide — a semiconductor material which is frequently used in these devices — said limit value of $n_o \times L$ lies in the order of $10^{12}$cm.$^{-2}$ ($n_o$ in electrons/ccm. and L in cm). See the above-mentioned article in "Proceedings IEEE." As a result of this, both the doping of the active epitaxial layer and the distance between cathode and anode in the known devices are restricted to rather stringent limitation.

It is the object of the invention to provide a device in which the restrictions to which the above-described known devices are subject, are reduced considerably.

The invention is based on the recognition of the fact that by using a high-ohmic boundary region adjoining the epitaxial layer in which the connection contacts are provided in the direction of the layer at a distance from each other, the limit value of the said $n_o$L-product above which the construction of domains of high field strength occurs can be increased considerably.

According to the invention, a semiconductor device of the type mentioned in the preamble is therefore characterized in that the epitaxial layer adjoins a boundary region having a resistivity which is higher than the resistivity of the epitaxial layer, the connection contacts being provided in the direction of the layer at a distance from each other, all this in such manner that no formation of domains of high field strength can occur in the epitaxial layer. The connection contacts may be provided either on the same side or on oppositely located sides of the epitaxial layer.

The boundary region is preferably formed by at least a part of the substrate.

The device according to the invention inter alia has the important advantage that the product of the concentration $n_o$ of majority charge carriers in the epitaxial layer and the distance L between the connection contacts can be considerably larger than in the above described known devices without the formation of domains of high field strength occurring. This may be explained as follows: If between the cathode contact and the anode contact a local deviation in electron density and hence a space charge region is formed, for example, as a result of an input signal applied between the anode and the cathode, said space charge region will move from the cathode to the anode and grow as a result of the negative differential resistance which is produced by the voltage difference between the cathode and the anode in the epitaxial semiconductor layer. The growing of said space charge region should be restricted since in the case of too strong a growth, the above-mentioned domain formation may occur. In the known device, in which the epitaxial layer is provided on a strongly doped substrate, the lines of electric field strength starting from said space charge will substantially all of them extend substantially parallel to the field applied between the anode and the cathode and give a contribution to the said growth of the space charge. Therefore in the known device the distance L between the anode and the cathode is restricted to a few microns, and the doping concentration $n_o$ of the layer may also be none too high.

In the device according to the invention, however, a comparatively large part of the field lines starting from the space charge will extend via the high-ohmic boundary region, so that the field strength component in the direction of the layer (the longitudinal field strength) which determines the said growth of the space charge region is reduced considerably and therefore a considerably larger distance L between the connection contacts and/or a considerably higher doping concentration $n_o$ of the active epitaxial layer can be used. As a result of this, inter alia the manufacture of the device according to the invention is considerably facilitated.

The taking up of the electric field lines to a considerable extent by a boundary region, on which principle the invention is inter alia based, as a result of which a decrease of the longitudinal field strength in the layer occurs, can be promoted considerably by causing the field lines to extend as much as possible at right angles to the boundary surface between the active layer and the boundary region, by an efficacious use of the dielectric constants of the active layer and of the boundary region. For that purpose, a boundary region is advantageously used which has a relative dielectric constant which is at least equal to and preferably at least two times larger than that of the active epitaxial layer, so that the field lines are bent in a direction at right angles to the boundary surface between the epitaxial layer and the boundary region. For example, the epitaxial layer may consist of $n$-type gallium arsenide while the boundary region contains barium titanate, strontium titanate or titanium dioxide.

When the thickness of the active epitaxial layer becomes large with respect to the dimensions of the space charge region in the direction of the layer, a comparatively large part of the field lines will extend inside the layer in the direction from the cathode to the anode. In order to check the formation of domains as much as possible it is therefore desirable that the thickness of the active epitaxial layer be considerably smaller and preferably at least two times smaller than the length of a domain calculated from the cathode to the anode, which domain might be formed if the layer thickness was unlimited. This length depends upon various factors. It can be proved (see "Bell System Technical Journal," Vol. 46, Dec., 1967, number 10, p. 2,257) that the domain length is substantially equal to $$\sqrt{\frac{2V\epsilon_o\epsilon_r}{en_o}}$$

in which V is the voltage drop in volts across the domain, $\epsilon_r$ the relative dielectric constant of the layer, $n_o$ the concentration of majority charge carriers in the layer per $m^3$.

$e$. the electron charge in Coulombs, and $\epsilon_o$ the dielectric constant of the vacuum in F./m.

The minimum domain length therefore occurs at the critical minimum field strength $E_c$, in which domain formation can occur in the material in question. It has been found in practice that with fair approximation $V=E_cL/2$ , where $L$ is the (minimum) distance between the connection contacts. The minimum domain length hence is to an approximation $$\sqrt{\frac{E_c \cdot L \cdot \epsilon_o\epsilon_r}{en_o}}.$$

An important preferred embodiment of the device is therefore characterized according to the invention in that the thickness of the epitaxial layer is at most equal to $$\frac{1}{2}\sqrt{\frac{E_c \cdot L \cdot \epsilon_o\epsilon_r}{en_o}},$$

where $E_c$ is the critical field strength in volt/m. above which formation of domains in the semiconductor material of the layer can occur, $L$ is the smallest distance in $m$ between the connection contacts, $\epsilon_r$ is the relative dielectric constant of the layer, $e$ is the electron charge in Coulombs, $n_o$ the concentration of majority charge carriers of the layer per $m.^3$, and $\epsilon_o$ is the dielectric constant of the vacuum in F/m. This gives an upper limit for the ratio between the layer thickness and contact distance below which the formation of domains is considerably inhibited.

According to a further very important preferred embodiment the epitaxial layer consists of N-type gallium arsenide which is grown epitaxially on a substrate of semiinsulating gallium arsenide having a resistivity of at least 1,000 ohm. cm. Semiinsulating gallium arsenide which has a very high resistivity and is suitable for use as a substrate can be obtained rather simply as a compensated material. The resistivity of the epitaxial layer is preferably chosen between approximately 0.1 ohm. cm. and approximately 10 ohm. cm which can be realized easily in a reproducible manner with the known epitaxial methods of growing.

It is to be noted that a device is known from "Engineering" vol. 200, Aug. 20, 1965, p. 244 which contains a substrate of semiinsulating gallium arsenide with an epitaxial layer of gallium arsenide 15 $\mu$m. thick, on which two connection contacts are provided. This device is a Gunn effect oscillator, in which the formation of domains of high field strength occurs in the epitaxial layer, so that high frequency electric oscillations are produced between the connection contacts. Such devices in which the formation of domains occurs, however, do not fall within the scope of the present invention. The invention relates only to devices in which the negative differential resistance in the epitaxial layer is used without the formation of domains and consequently undesired oscillations occurring, and in which there is always operated within the negative resistance region in the operating condition.

In connection with the above-described restricting conditions regarding the layer thickness, said thickness is advantageously chosen to be at most equal to 5 $\mu$m. and preferably at most equal to 1 $\mu$m., so that at the normally used voltage, contact distance and doping, the formation of domains is prevented using layer thicknesses which, can easily be realized technologically.

Instead of by a part of the substrate, or by the substrate as a whole, the boundary surface can in circumstances be advantageously formed by a semiconductor layer which is provided on the epitaxial layer on the side of the epitaxial layer remote from the substrate. The same effect of reducing the longitudinal field strength component in the layer can be obtained. This effect can even further be intensified by using both a first boundary region forming part of the substrate and a second boundary region provided on the side of the epitaxial layer remote from the substrate.

According to a further preferred embodiment the minimum distance between the connection contacts is chosen to be at least equal to 100 $\mu$m. In the device according to the invention this can be realized without objections, in contrast with known devices, while connection contacts with a mutual distance of said order of magnitude can be manufactured in a very readily reproducible manner. This comparatively large contact distance permits inter alia of providing a control electrode between the connection contacts, for example, analogous to the gate electrode of a MOS transistor, by providing a metal layer on an insulating layer provided on the epitaxial layer. So far, this has not been possible in devices of the type to which the present invention relates, owing to the small contact distance.

Another very important preferred embodiment of the device according to the invention in which the input coupling and output coupling of the input signal and the output signal, respectively, can be optimalized in a simple manner is characterized in that an input contact is provided between the cathode contact and the anode contact, an alternating signal to be amplified being applied between the input contact and the first connection contact. In such an embodiment, in which a separate input contact is present, an optimum input coupling can be obtained independently of the distance between the connection contacts. Actually, it can be calculated that an input coupling which is as favorable as possible occurs if $L_1$ is approximately equal to $n\cdot(v/f)$ where $L_1$ is the distance in cm. between the input contact and the first connection contact, $v$ is the drift velocity in cm./sec. of the majority charge carriers in the epitaxial layer, $f$ the frequency of the alternating voltage to be amplified, and $n$ an integer. Quite independent of the requirements to be imposed upon the input coupling, a value may be chosen for L, the distance between the cathode and the anode, which is as favorable as possible in connection with the electrical properties and the thickness of the epitaxial layer. In an embodiment in which only the two connection contacts are present with a mutual distance $L$, $L \approx n\cdot(v/f)$ should be chosen for maximum amplification where $n$, $v$ and $f$ have the above meanings. See "Transactions I.E.E.E.," vol.ED.13, Jan., 1966, pp. 4–21, particularly p.16, FIG. 9. In this connection, a further preferred embodiment is even more favorable in which in addition to an input contact, an output contact is provided between the connection contacts. In this case an optimum output coupling can also be ensured independent of other factors for which coupling it holds good, according to calculations, that the distance between the output contact and the second connection contact must be substantially equal to $(m+½)\cdot(v/f)$ where $v$ and $f$ have the above meanings and $m$ again is an integer.

In connection with the last-mentioned preferred embodiments it is to be noted that a semiconductor device is known from "I.E.E.E. Transactions Electron Devices.", ED 14. Sept. 1967, pp. 612–615, which comprises a semiconductor body of very high-ohmic N-type gallium arsenide which is provided with two connection contacts for establishing a negative differential resistance and with an input contact and an output contact. This known device, like the last-mentioned preferred embodiment according to the invention, is of the "travelling wave" type with amplification in the negative resistance region without domain formation. In contrast with the invention, however, the semiconductor body consists of a homogeneous gallium arsenide body having a very high resistivity (>>100 Ohm.cm.) which is very hard to manufacture in a reproducible manner. This is necessary because this known device, like the already described known devices, is restricted to an $n_oL$ product of the order of $10^{12}$ cm.$^{-2}$, in contrast with the device according to the invention, so that in this case also the maximum permissible distance between the contacts, dependent upon the doping concentration, is rather small.

Figure 2:
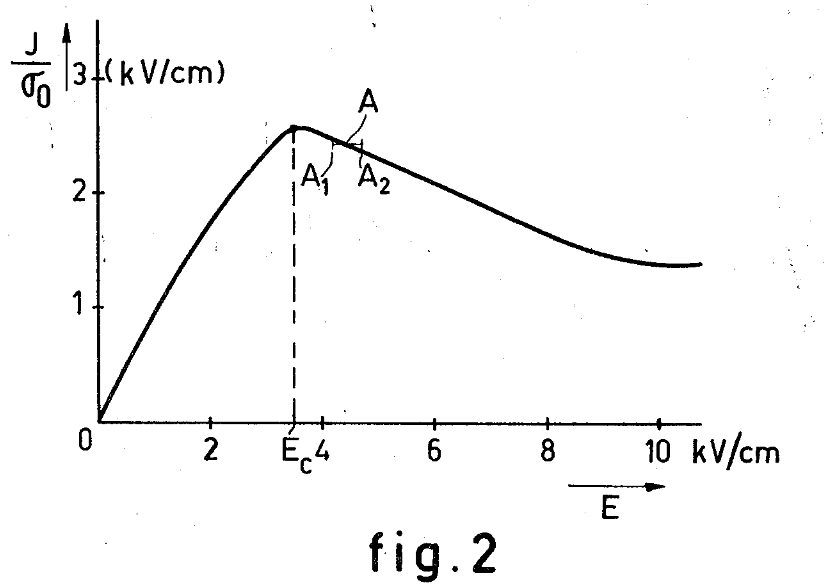

In the device according to the invention on the contrary the possibility exists of making the distance between the contacts, and in particular the distance between the input contact and the output contact, rather large, preferably at least equal to 200 $\mu$m., so that, if desirable, a control electrode can be provided between said contacts, for example, analogous to the gate electrode of a MOS transistor, by providing a metal layer on an oxide layer provided on the epitaxial layer, In order that the invention may be readily carried into effect, it will now be described in greater detail, by way examples, with reference to the accompanying drawings, in which FIG. 1 is a diagrammatic perspective view of a semiconductor device according to the invention, FIG. 2 is a graph showing the relationship between on the one hand the field strength E, and on the other hand the current density J in the direction of the field strength divided by the specific conductivity $\sigma_o$ at low fieldstrength, for a body of N-type gallium arsenide.

Figure 3:
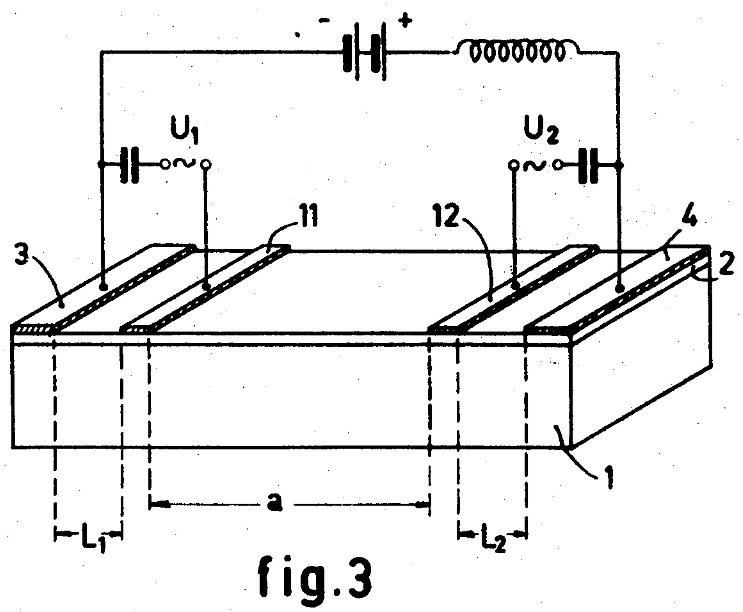
Figure 4:
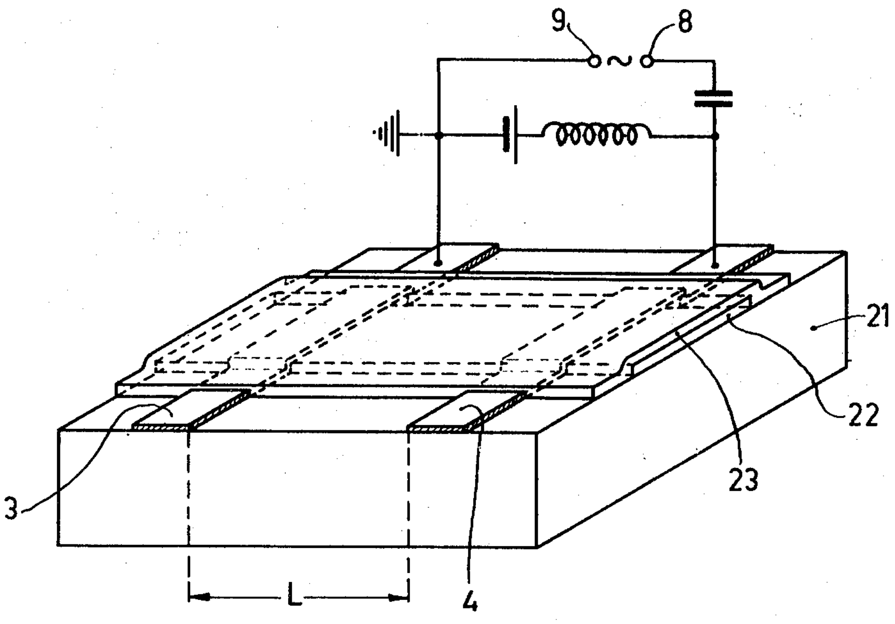

FIG. 3 is a diagrammatic perspective view of another device according to the invention and FIG. 4 is a diagrammatic perspective view of a third device according to the invention.

For reasons of clarity the FIGS. 1, 2, 3 and 4 are diagrammatic and not drawn to scale. This holds in particular for the dimensions in the direction of the thickness. Corresponding components in the Figures are referred to by the same reference numerals.

FIg. 1 is a diagrammatic perspective view of a semiconductor device according to the invention. The device comprises a substrate 1 of semiinsulating gallium arsenide having a resistivity of $10^4$ ohm. cm, a thickness of 75 $\mu$m., a length of 200 $\mu$m. and a width of 100 $\mu$m., in which an epitaxial layer 2 of N-type gallium arsenide 9 is provided having a resistivity of 1 ohm. cm. and a thickness of 1 $\mu$m. Two connection contacts, namely a cathode contact 3 and an anode contact 4 in the form of alloyed parallel tin strips, are provided on the upper side of said layer.

The layer 2 adjoins the boundary region which in this embodiment is formed by the whole substrate 1. In circumstances, however, the substrate may alternatively consist of a highly doped substrate 5 on which a boundary region is provided consisting of a layer 6 of semiinsulating gallium arsenide having a resistivity of $10^4$ ohm.cm. and a thickness of, for example, 10 $\mu$m. adjoining the layer 2, the two substrate regions 5 and 6 being separated by the dot-and-dash line 7, (see FIG. 1).

The mutual distance L between the contacts 3 and 4 is 120 $\mu$m. In the layer 2, a negative differential resistance can be adjusted when the direct voltage between the contacts 3 and 4 is sufficiently high. This is shown in FIG. 2, in which for N-type gallium arsenide the relationship is shown between the field strength E prevailing in the material and the current density J which occurs in the direction of said field strength due to the field strength. This current density J is further more linearly dependent on the conductivity $\sigma_o$ of the material at low field strengths, so that in FIG. 2, the value of $J/\sigma_o$ is plotted. Both $J/\sigma_o$ and E in FIG. 2 have the dimension of kilovolt (kv.) per cm. It is seen from the variation of the curve that beyond a critical field strength $E_c$ of approximately 3.5 kv./cm., a region of negative differential resistance occurs. In the device described here, the critical voltage difference between the cathode and the anode therefore is 0.012×3500=42 volt.

The minimum domain dimension in the direction from the cathode to the anode is, as already described, given to an approximation by the formula $$\sqrt{\frac{E_c \cdot L \cdot \epsilon_o \cdot \epsilon_r}{en_o}}$$

For the layer 2 of N-type gallium arsenide used here having a resistivity of 1 ohm.cm. it holds according to the above that:

$$E_c=3.5\cdot10^5 \text{ V m.}^{-1}$$
$$L=1.2\cdot10^{-4}\text{m.}$$
$$\epsilon_o=8.854\cdot10^{-12}\text{Fm.}^{-1}$$
$$\epsilon_r=13.5$$
$$e=1.6\cdot10^{-19}\text{C}$$
$$n_o=10^{21}\text{m.}^{-3}.$$

From this follows a minimum domain length of 5.6 $\mu$m. The layer 2 in this example therefore has a thickness which is smaller than half of said minimum domain length, so that the formation of domains is considerably inhibited. As a result of this, the comparatively large cathode-anode distance of 120 $\mu$m. may be used without the danger existing of the formation of domains, The above-mentioned $n_oL$ product is $1.2\cdot10^{13}$ cm.$^{-2}$ in this case, which is higher by approximately an order of magnitude than is admissible in the known devices of the present type.

The device is operated as follows, see FIG. 1.

A direct voltage $V_E$ of 54 volt is set up between the connection contacts 3 and 4 in series with a choke coil. As a result of this a field strength of 4.5 kv./cm. is formed in the layer 2 between the cathode and the anode, so that the operating point of the device (see FIG. 2) becomes located in the point A and hence a negative differential resistance is established between the cathode and the anode. Via a coaxial cable having a core 8 and a sheath 9 (see FIG. 1), an input alternating voltage is applied between the contacts 3 and 4 while using a decoupling capacity, this input signal having a frequency of 0.8 GHz., (0.8.$10^9$ sec$^{-1}$) and an amplitude which is sufficiently large so that the resulting field strength always remains within the region of negative differential resistance. See FIG. 2, in which the field strength variation is shown for clarity between the values $A_1$ and $A_2$ around the point A. The sheath 9 and the cathode 3 are grounded (see FIG. 1).

As a result of the negative differential resistance the input signal in the layer 2 will be amplified and be conducted away again via the coaxial cable (8, 9) as a reflected signal in an amplified form. Since furthermore with the applied direct voltage the drift velocity V of the electrons from the cathode to the anode is approximately $10^7$ cm./sec., while the distance L from the cathode to the anode is 0.012 cm., the frequency of the input signal, as appears from the above, is substantially equal to V/L so that a maximum amplification is achieved.

The device shown in FIG. 1, can be manufactured as follows: Starting material is a plate of semiinsulating gallium arsenide, having a resistivity of $10^4$ ohm.cm. A surface hereof is polished and etched to form a surface having a minimum of crystal defects. A layer 2 of N-type gallium arsenide is epitaxially deposited from the vapor phase on the resulting surface. This is carried out at approximately 750° C. by reaction between gallium and arsenic, the gallium being obtained by decomposition of gallium monochloride and the arsenic by reduction of arsenic trichloride with hydrogen. Simultaneously with the growing of the gallium arsenide, a donor, for example, silicon, tellurium, tin or selenium, is deposited in such a quantity that an epitaxial layer 2 having a uniform donor concentration of approximately $10^{15}$ at./ccm. is formed which corresponds to a resistivity of approximately 10 ohm.cm. The growing is continued until a layer of 1 $\mu$m. thickness is formed.

Tin strips 3 and 4 having a width of 25 $\mu$m. are then provided on the surface of the layer 2 and are alloyed at a temperature of 650° C. in a hydrogen atmosphere. As a result of this, ohmic contacts are formed on the layer 2.

Connection conductors are then secured to the alloyed tin contacts 3 and 4, after which the assembly is provided in a suitable envelope.

FIG. 3 is a diagrammatic perspective view of another device according to the invention. In this device the substrate 1 and the epitaxial layer 2 consist of the same materials as in FIG. 1, while also the same thicknesses and dopings are used. In contrast with the device shown in FIG. 1, however, an input contact 11 and an output contact 12, likewise in the form of alloyed tin strips having a width of 15 µm., are provided between the cathode contact 3 and the anode contact 4 in the device shown in FIG. 3. The distance $L_1$ between the contacts 3 and 11 (see FIG. 3) is equal to 100 µm., the distance *a* between the contacts 11 and 12 is equal to 250 µm., and the distance $L_2$ between the contacts 12 and 4 is equal to 150 µm.

In the operating condition, for example, in the device shown in FIG. 3, a direct voltage of 240 volt is applied between the cathode contact 3 and the anode contact 4 which, as appears from the above, have a mutual distance of 530 µm., so as to produce, like in the example shown in FIG. 1, a field strength of approximately 4.5 kv./cm. in the layer 2 to adjust an operating point in the region of negative differential resistance.

An input alternating voltage $U_1$ is applied between the contacts 3 and 11 (see FIG. 3) via a decoupling capacitor. The resulting space charge wave traverses the layer 2 in the direction from the cathode to the anode and is amplified as result of the negative differential resistance, so that between the contacts 12 and 4 an amplified output signal $U_2$ of equal frequency can be derived. The frequency of the signals $U_1$ and $U_2$ is 1 GHz. ($10^9$ sec$^{-1}$). Since the drift velocity $v$ of the electrons in the layer 2 at the applied field strength is $10^7$ cm./sec., it holds for the frequency $f$ of the signals $U_1$ and $U_2$ that substantially:

$$f = V/L_1 = 3/2v/L_2,$$

so that an input coupling and output coupling which are as favorable as possible are obtained.

The device shown in FIG. 3 can be manufactured in a manner entirely analogous to that of the device described with reference to FIG. 1, in which it should be ensured, however, that the tin contacts 11 and 12, may not alloy into the layer 2 too deeply.

FIG. 4 shows a third device according to the invention. This device comprises a substrate 21 of semiinsulating gallium arsenide having a resistivity of approximately $10^4$ ohm.cm on which an epitaxial layer 22 of N-type gallium arsenide having a resistivity of 1 ohm.cm. and a thickness of 1 µm. is provided. On this layer a cathode contact 3 and an anode contact 4 in the form of alloyed tin strips are provided.

A layer 23 consisting of an epoxy resin comprising approximately 40 percent by volume of barium titanate is provided on the layer 22 and the contacts 3 and 4. Barium titanate has a relative dielectric constant which is very much higher than that of gallium arsenide, so that the relative dielectric constant of the layer 23 is considerably higher, at least by a factor 5, than that of the layer 22. So in this device the layer 22 is bounded by a first boundary region which is constituted by the substrate 21, and by a second boundary region which is constituted by the layer 23. As a result of this the effect of reduction of the field strength component of the space charge in the direction of the layer is considerably intensified with respect to, for example, the device shown in FIG. 1. In order to obtain homogeneous field distribution in the layer 22, it is desirable that, as shown in FIG. 4, the barium titanate layer 23 extend at least up to the contacts 3 and 4. The distance L between the cathode contact 3 and the anode contact 4 is 120 µm., like in the device shown in FIG. 1, while also the dimensions of the length and width of the layer 22 are equal to those of the layer 2 in FIG. 1. The device is connected and operated in the same manner as is described with reference to the example shown in FIG. 1.

The device shown in FIG. 4 can be manufactured as follows. Starting material is a semi-insulating plate of gallium arsenide 21 of 200×200 µm., having a resistivity of $10^4$ ohm. cm. on which an N-type gallium arsenide layer 22 of 1 µm. thickness and resistivity 1 ohm.cm., is grown epitaxially in quite the same manner as described with reference to FIG. 1. The layer 22 is then etched away partly while using a photoresist method which is commonly used in semiconductor technology and in which a solution of 3 parts by volume of concentrated sulphuric acid, 1 part by volume of 30 percent hydrogen peroxide, and 1 part by volume of water are used as an etchant at a temperature of 60° C. A layer 22 having a length of 200 µm. and a width of 100 µm. remains.

The tin strips 3 and 4 are then provided on the layer 22 and on the substrate 21 and alloyed in a hydrogen atmcsphere at 650° C. for a few minutes.

A suspension consisting of an epoxy resin dissolved in ethyl acetate with 40 percent by volume of barium titanate powder is then provided over the whole layer 22 and over part of the substrate. After evaporating the solvent and hardening the epoxy resin, a layer 23 is formed, thickness 2 to 3 µm. The structure shown in FIg. 4 is obtained in which the contacts 3 and 4 project partly from the layer 23 and can be provided with connection conductors. The assembly is then provided in a suitable envelope.

It will be obvious that the invention is not restricted to the examples described and that many variations are possible to those skilled in the art without departing therefore from the scope of the present invention. For example, the substrate may consist of materials other than semiinsulating gallium arsenide or of a low-ohmic part on which a high-ohmic layer is provided. Furthermore the high-ohmic substrate may form a PN-junction with the active epitaxial layer. Instead of N-type gallium arsenide, the active epitaxial layer may consist of cadmium telluride, indium phosphide, cadmium telluride, zinc selenide or another suitable material which has a current-voltage characteristic analogous to that of FIG. 2. Furthermore, the dimensions of the device and notably the geometry of the contacts may be varied within wide limits, for example, by using concentric instead of striplike contacts, while control electrodes can be provided on various places on the active epitaxial layer.

What is claimed is:

1. A semiconductor device for amplifying microwave signals comprising a monocrystalline substrate of semiconductor material, an active epitaxial semiconductor layer on said substrate and exhibiting a negative differential resistance above a threshold field strength, first and second contacts to the active layer portion and spaced apart by a distance L in the longitudinal direction of the layer for applying a direct voltage of such magnitude as to produce the said negative differential resistance in the active layer portion between the contacts tending to establish undesired travelling domains of high field strength within the active layer portion, and a domain suppressing layer on the active layer over a substantial part of the distance between the contacts and having a higher resistivity than the resistivity of the semiconductor material in the active layer between the contacts and a relative dielectric constant at least two times larger than that of the active layer, the surface of said domain suppressing layer being free of an electrode, the semiconductive layer having a thickness less than $$\sqrt{\frac{E_c L \epsilon_0 \epsilon_r}{e n_o}},$$

where $E_c$ is the critical field strength in volt/m. above which domains can form in the active layer, L is the minimum distance in *m* between the contacts, $\epsilon_0$ is the dielectric constant of vacuum in F/m., $\epsilon_r$ is the relative dielectric constant of the semiconductor layer, e is the electron charge in Coulombs, and $n_o$ is the majority charge carrier concentration/m.$^3$ of the active layer, whereby the undesired travelling domains are suppressed.

2. A semiconductor amplifying device as set forth in claim 1 wherein the substrate part adjacent the active layer has a higher resistivity than that of the active layer, and the contact spacing L is such that the product $n_o$L is substantially greater than $10^{12}$ cm.$^{-2}$ where $n_o$ is in electrons/ccm and L is in cm.

3. A semiconductor amplifying device as claimed in claim 2 wherein the epitaxial layer comprises N-type gallium arsenide having a resistivity between approximately 0.1–10 ohm.cm., and the substrate comprises semiinsulating gallium arsenide having a resistivity of at least 1,000 ohm.cm.

4. A semiconductor amplifying device as claimed in claim 3 wherein the epitaxial layer has a thickness of at most 1 $\mu$m.

5. A semiconductor amplifying device as claimed in claim 1 wherein the active layer comprises N-type gallium arsenide and the domain suppressing layer contains barium titanate, strontium titanate or titanium dioxide.

* * * * *